US009319027B1

(12) United States Patent
Rafi

(10) Patent No.: US 9,319,027 B1
(45) Date of Patent: Apr. 19, 2016

(54) INJECTING A TONE FOR IMAGE REJECTION CALIBRATION

(71) Applicant: Silicon Laboratories Inc., Austin, TX (US)

(72) Inventor: Aslamali A. Rafi, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 14/573,144

(22) Filed: Dec. 17, 2014

(51) Int. Cl.
*H04B 1/10* (2006.01)
*H04B 17/21* (2015.01)
*H03H 11/04* (2006.01)
*H03F 3/19* (2006.01)
*H03F 3/45* (2006.01)
*H03H 11/32* (2006.01)
*H03L 7/099* (2006.01)
*H04B 1/26* (2006.01)

(52) U.S. Cl.
CPC .............. *H03H 11/0466* (2013.01); *H03F 3/19* (2013.01); *H03F 3/45076* (2013.01); *H03H 11/32* (2013.01); *H03L 7/099* (2013.01); *H04B 1/26* (2013.01); *H04B 17/21* (2015.01); *H03F 2200/451* (2013.01); *H03F 2203/45116* (2013.01)

(58) Field of Classification Search
CPC .......... H04B 1/0085; H04B 1/10; H04B 1/30; H04B 17/21
See application file for complete search history.

(56) References Cited

U.S. PATENT DOCUMENTS

| | | | |
|---|---|---|---|
| 4,345,241 A | 8/1982 | Takeuchi et al. | |
| 5,740,208 A | 4/1998 | Hulbert et al. | |
| 6,456,316 B1 | 9/2002 | Jun | |
| 6,606,010 B1 | 8/2003 | Poklemba et al. | |
| 6,744,829 B1 | 6/2004 | Mohindra | |
| 6,792,054 B1 | 9/2004 | Bitran et al. | |
| 6,892,060 B2 | 5/2005 | Zheng | |
| 6,959,016 B1 | 10/2005 | Keeth et al. | |
| 7,158,586 B2 | 1/2007 | Husted | |
| 7,477,881 B2 | 1/2009 | Kim | |
| 7,522,899 B1 | 4/2009 | He | |
| 7,580,680 B2 | 8/2009 | Isaac et al. | |
| 7,636,558 B2 | 12/2009 | Olson | |
| 7,684,778 B1 | 3/2010 | Qian et al. | |
| 7,873,342 B2 | 1/2011 | Lim et al. | |
| 7,903,771 B2 | 3/2011 | Cho et al. | |
| 8,064,863 B1 * | 11/2011 | Reed et al. | 455/285 |
| 8,265,584 B2 | 9/2012 | Khoury et al. | |
| 8,326,252 B2 | 12/2012 | Li | |
| 2004/0002323 A1 | 1/2004 | Zheng | |

(Continued)

OTHER PUBLICATIONS

U.S. Appl. No. 14/549,910, filed Nov. 21, 2014, entitled "Image Rejection Calibration With a Passive Network," by John M. Khoury, et al.

(Continued)

*Primary Examiner* — Aristocratis Fotakis
(74) *Attorney, Agent, or Firm* — Trop, Pruner & Hu, P.C.

(57) ABSTRACT

In an example, apparatus comprises: a low noise amplifier (LNA) including a first transconductor having an input to receive a differential input radio frequency (RF) signal and an output to output a differential amplified RF signal to a RF signal path; and a second transconductor having an input coupled to a first common mode node and a second common mode node to receive a test tone signal and an output to output an amplified test tone signal to the RF signal path.

20 Claims, 11 Drawing Sheets

(56) References Cited

U.S. PATENT DOCUMENTS

| | | | |
|---|---|---|---|
| 2005/0069056 A1* | 3/2005 | Willingham | 375/327 |
| 2005/0070236 A1* | 3/2005 | Paulus | 455/135 |
| 2005/0089120 A1 | 4/2005 | Quinlan | |
| 2005/0135521 A1 | 6/2005 | Nemer et al. | |
| 2005/0148304 A1 | 7/2005 | Jerng | |
| 2005/0243949 A1 | 11/2005 | Khoini-Poorfard | |
| 2006/0003722 A1 | 1/2006 | Tuttle et al. | |
| 2006/0111072 A1* | 5/2006 | Kerth et al. | 455/302 |
| 2006/0128338 A1* | 6/2006 | Kerth et al. | 455/285 |
| 2007/0080835 A1* | 4/2007 | Maeda et al. | 341/120 |
| 2007/0097271 A1* | 5/2007 | Gao et al. | 348/724 |
| 2007/0237264 A1 | 10/2007 | Huang et al. | |
| 2008/0057899 A1* | 3/2008 | Montemayor et al. | 455/255 |
| 2008/0089397 A1 | 4/2008 | Vetter et al. | |
| 2008/0096513 A1 | 4/2008 | Lim et al. | |
| 2008/0130800 A1* | 6/2008 | Maxim et al. | 375/345 |
| 2009/0058705 A1 | 3/2009 | Cetin et al. | |
| 2010/0159858 A1 | 6/2010 | Dent et al. | |
| 2010/0167680 A1 | 7/2010 | Li et al. | |
| 2010/0233971 A1* | 9/2010 | Vassiliou et al. | 455/73 |
| 2010/0278285 A1* | 11/2010 | Lin | 375/327 |
| 2010/0330947 A1 | 12/2010 | Khoury et al. | |
| 2011/0086605 A1* | 4/2011 | Chanca et al. | 455/302 |
| 2011/0189970 A1 | 8/2011 | Ohshiro | |

OTHER PUBLICATIONS

Keng Leon Fong, et al., "High Frequency Nonlinearity Analysis of Common-Emitter and Differential-Pair Transconductance Stages," IEEE Journal of Solid State Circuits, vol. 33, No. 4, pp. 548-555, Apr. 1998.

Keng Leong Fong, et al., "A Class AB Monolithic Mixer for 900 MHz Applications," IEEE Journal of Solid-State Circuits, pp. 1166-1172, Aug. 1997.

Keng Leong Fong, et al., "2.4 Monolithic Mixer for Wireless LAN Applications," IEEE Custon Integrated Circuits Conference, pp. 9.4.1-9.4.4, May 1997.

Stefaan Van Gerven, et al., "Signal Separation by Symmetric Adaptive Decorrelation: Stability, Convergence, and Uniqueness," IEEE Transactions on Signal Processing, pp. 1602-1612, Jul. 1995.

Fred Harris, "Digital Filter Equalization of Analog Gain and Phase Mismatch in I-Q Receivers," 1996, pp. 793-793.

Stefaan Van Gerven, et al., "On the Use of Decorreleation in Scalar Signal Separation," IEEE, 1994, pp. 57-60.

Mikko Valkama, et al., "Advanced Methods for I/Q Imbalance Compensation in Communication Receivers," IEEE Transactions on Signal Processing, Oct. 2001, pp. 2335-2344.

Dirk Van Compernolle, et al., "Signal Separation in a Symmetric Adaptive Noise Canceller by Output Decorrelation," 1992, pp. 221-224.

Farbod Behbahani, et al., "CMOS Mixers and Polyphase Filters for Large Image Rejection," IEEE Journal of Solid-State Circuits, Jun. 2001, pp. 873-887.

Li Yu, "A Novel Adaptive Mismatch Cancellation System for Quadrature If Radio Receivers," 1997, pp. 1-123.

Supisa Lerstaveesin, et al., "A Complex Image Rejection Circuit With Sign Detection Only," IEEE Journal of Solid-State Circuits, Dec. 2006, pp. 2693-2702.

U.S. Appl. No. 13/921,375, filed Jun. 19, 2013, entitled "Performing Image Rejection on Bandpass Signals," by John M. Khoury.

* cited by examiner

INJECTING A TONE FOR IMAGE REJECTION CALIBRATION

BACKGROUND

Many receivers include an in-phase/quadrature (I/Q) demodulation architecture, in which a received modulated carrier signal is simultaneously applied to an I-channel mixer and a Q-channel mixer. A local oscillator (LO) is also applied to the mixers to effect frequency conversion from a radio frequency (RF) at which the radio signal is received to an intermediate frequency (IF). In an I/Q demodulator, the LO signal that is applied to the Q-channel mixer is offset by 90° from the LO signal that is applied to the I-channel mixer.

Image rejection is one metric by which receiver system performance may be evaluated. In general, image rejection refers to the ability of the receiver to reject responses resulting from RF signals at a frequency offset from the desired RF carrier frequency by an amount equal to twice the IF of a superheterodyne receiver. For example, if the desired RF signal is at 100 megahertz (MHz), and the receiver IF is 4 MHz, then the receiver LO could be tuned to 96 MHz. However, as is well known to those skilled in the art, the receiver will also exhibit a response to undesired RF signals (i.e., image signals) at a frequency 4 MHz below the LO frequency, in this case, 92 MHz. The receiver's response to the 92 MHz signal is referred to as the image response, because the image signal resides at a frequency on the other side of the LO frequency from the desired RF carrier, and offset from the LO frequency by the magnitude of the IF. A similar image signal appears to the high side when the LO is greater than the desired RF carrier and the image frequency is larger than the LO frequency.

In a typical low-IF receiver architecture, mismatch between in-phase and quadrature phase paths causes image interference cross-talk. In many receivers, one or more strong adjacent channels may become the image interference and make reception unacceptable.

SUMMARY OF THE INVENTION

In one aspect, an apparatus comprises: a low noise amplifier (LNA) including a first transconductor having an input to receive a differential input radio frequency (RF) signal and an output to output a differential amplified RF signal to a RF signal path; and a second transconductor having an input coupled to a first common mode node and a second common mode node to receive a test tone signal and an output to output an amplified test tone signal to the RF signal path.

The apparatus may further include a controller to enable the second transconductor during a test mode and to thereafter disable the second transconductor, and disable the first transconductor during the test mode and to thereafter enable the first transconductor.

In an example, an auxiliary phase lock loop (PLL) may generate the test tone signal, where the auxiliary PLL is coupled to the first common mode node and the second common mode node via a buffer.

In another example, an injection source to provide the test tone signal to the second transconductor includes: an oscillator to generate the test tone signal; and a buffer having a cascoded differential amplifier having an input coupled to the oscillator to receive the test tone signal and an output coupled to the first common mode node and the second common mode node to provide the test tone signal to the second transconductor.

In another aspect, a tuner comprises: a RF signal path having a first signal path portion and a second signal path portion; a first differential transconductor coupled to receive a RF signal via the first signal path portion and the second signal path portion and to output an amplified RF signal to a mixer; and a second differential transconductor coupled to receive a test signal in a test mode and to output a test output to the mixer.

In an example, a controller may cause a PLL coupled between a first common mode node and a second common mode node and the second differential transconductor to generate the test signal at a second frequency, the second frequency offset from a frequency of a local oscillator by an offset value, the local oscillator to generate a mixing signal to enable the mixer to downconvert the amplified RF signal to a downconverted frequency signal. In some cases, the test output may include an image rejection calibration source to calibrate an image rejection circuit of the tuner.

The controller may enable the second differential transconductor during the test mode and to thereafter disable the second differential transconductor, and disable the first differential transconductor during the test mode and to thereafter enable the first differential transconductor.

In another aspect, a method comprises: disabling a LNA of a receiver during a test mode; enabling an injection source of the receiver during the test mode, the injection source coupled between common mode nodes at an input of the LNA and an input of a transconductor, the transconductor having an output to couple to an output of the LNA during the test mode; injecting, via the injection source, a tone into the receiver at a frequency of an image band; measuring a signal power in a desired band responsive to processing the injected tone in the receiver; and calibrating an image rejection circuit of the receiver based at least in part on the signal power.

In an example, the LNA may be disabled by steering a current output of the LNA to a voltage regulator, and enabling the injection source comprises coupling a PLL to a buffer, the buffer coupled to the input of the transconductor.

DETAILED DESCRIPTION

Due to mismatches in an analog front end of a receiver having a complex signal path (i.e., in-phase (I) and quadrature (Q) signal paths), part of an interference (e.g., image) signal may be within a desired signal band (and vice-versa). Embodiments seek to prevent the interference signal from contaminating the desired signal. In some embodiments, passive circuitry of a receiver can be used to remove undesired image information, at low power and low complexity. Further, this circuitry may be implemented in analog circuitry after initial downconversion and before digitization occurs.

To enable such image rejection circuitry to operate properly, an image rejection calibration process may be performed to enable an appropriate amount of image rejection to occur. To this end, embodiments provide a mechanism to insert a test tone signal into a receiver to enable calibration of an image rejection circuit based on input of this known test tone signal (e.g., at a predetermined frequency and power level). At the same time, this test tone signal may be generated at a location within the receiver and in a manner to ensure that certain non-linearities, such as image rejection degradation occurring prior to mixing of a radio frequency (RF) signal, may similarly be present in this test tone signal. Still further, the test tone signal may be generated at a location and in a manner to reduce or prevent unwanted emission of the test tone signal from an antenna.

Figure 1:
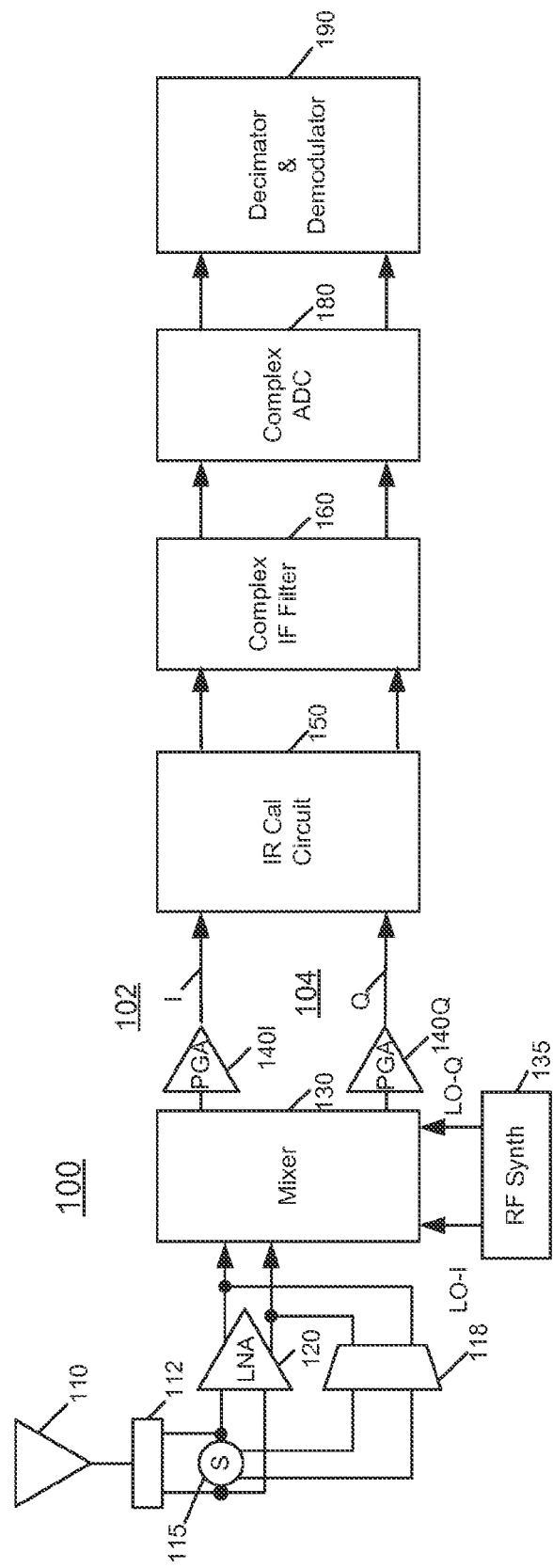
FIG. 1 is a block diagram of a receiver in accordance with an embodiment.

Referring now to FIG. 1, shown is a block diagram of a receiver in accordance with an embodiment. As shown in FIG. 1, receiver 100, which may be implemented on a single semiconductor die, is configured to receive and process an incoming RF signal into a demodulated signal that can be provided for further processing, e.g., digital data processing and thereafter output to an intended location. In the illustration of FIG. 1, receiver 100 includes an antenna 110. Note that antenna 110 in a given implementation may be an off-chip antenna that receives RF signals and provides them to a low noise amplifier (LNA) 120, which in an embodiment may be implemented with a transconductor element.

Although embodiments vary, in one implementation receiver 100 may be configured to receive wireless signals within a wireless local area network, e.g., Bluetooth™ signals, Zigbee™ signals, WLAN signals or so forth. Such signals may be received at a selected frequency, which in an embodiment may be 2.4 GHz. The incoming RF signals, as amplified by LNA 120 are provided to a mixer 130 which in an embodiment is a complex filter that may be implemented as an N-path filter. As seen, an RF synthesizer 135 (which may be implemented as a voltage controlled oscillator (VCO)) provides a complex local oscillator (LO) signal (namely signals LO-I and LO-Q) to mixer 130 to thus downconvert the incoming amplified RF signal to a lower frequency signal, which in an embodiment may be at an intermediate frequency (IF). Of course understand that in other receiver architectures, a mixer may operate to downconvert an incoming RF signal to another frequency such as a low-IF signal, near DC signal, baseband signal or so forth.

Still referring to FIG. 1, note the presence of an auxiliary path within receiver 100. More specifically, the auxiliary path includes a transconductor 118 which may be implemented as one or more transconductance slices to receive a test tone generated by an injection source 115, which is coupled at a common mode location of the RF signal path. Transconductor 118 may be configured to amplify this test tone and provide the amplified test tone to a remainder of the signal path, by differential connection to the output of LNA 120. Details of use of this auxiliary path for test operations will be described further herein.

Note further in FIG. 1 that receiver 100 is configured as a differential receiver, such that an incoming single-ended RF signal received by antenna 110 is coupled through a signal converter 112, which in an embodiment may be implemented via a balun to thus provide differential signals to the remainder of the signal processing path.

In the embodiment shown, receiver 100 is a complex receiver having an in-phase signal path 102 (also referred to herein as an "I path") and a quadrature signal path 104 (also referred to herein as a "Q path"). For ease of discussion, components within in-phase signal path 102 are discussed. Understand that similar components are present in quadrature signal path 104.

Still with reference to FIG. 1, the downconverted complex signals from mixer 130 are provided to a programmable gain amplifier (PGA) 140I/140Q where a controllable amount of gain may be provided to the signals. In turn, the amplified IF signals are provided to an IR calibration circuit 150. As will be described herein, IR calibration (IRCAL) circuit 150 may perform image rejection calibration in the analog signal path prior to any complex filtering, thus avoiding negating image band attenuation. While different types of IR rejection circuits may be present in an embodiment, a circuit may include independent phase correction and amplitude correction circuits such that the image rejection performed in IR calibration circuit 150 may occur in an orthogonal manner such that phase and amplitude correction is performed independently from each other and in any desired order, as corrections of phase do not affect signal amplitude and similarly, corrections of amplitude do not affect phase.

Referencing still to FIG. 1, the image rejection calibrated signals are provided to a complex IF filter 160, which performs complex filtering. The filtered signals are coupled to a complex analog-to-digital converter (ADC) 180, which may digitize the analog signals into a digital format to be provided to a decimator/demodulator 190, which may reduce a sample rate of the digitized signals and perform demodulation, among other processing. Understand while shown at this high level in the embodiment of FIG. 1, many variations and alternatives are possible.

Figure 2A:
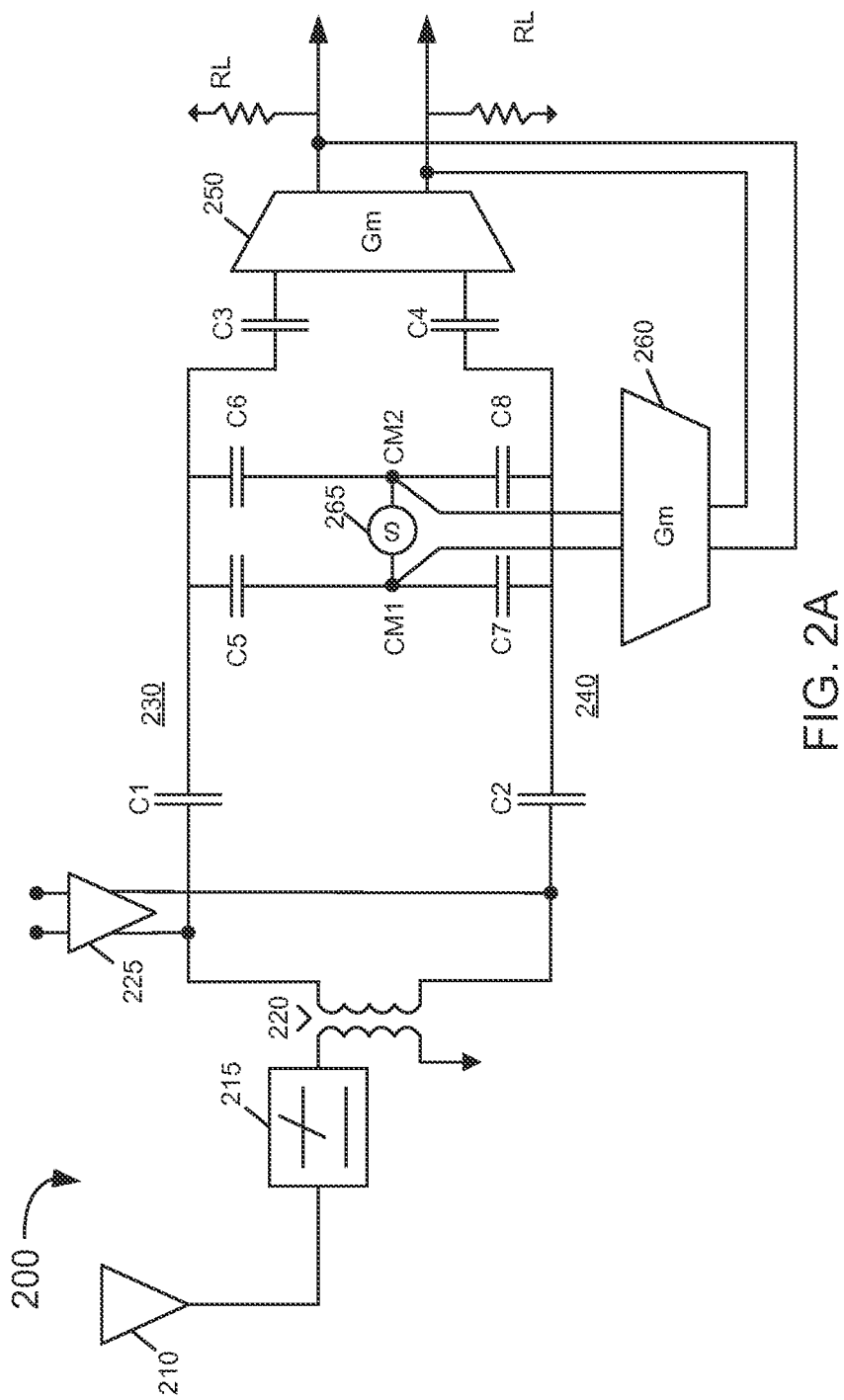
FIG. 2A is a block diagram of a portion of a tuner in accordance with an embodiment.

Referring now to FIG. 2A, shown is a block diagram of a portion of a tuner in accordance with an embodiment. In the embodiment shown in FIG. 2A, tuner 200 includes an IR calibration source configured to provide a test tone during a test mode. Otherwise, the IR calibration source may be controlled to be disabled so that it does not operate during normal system operation when the tuner is active. As will be described further herein, the IR calibration source may be provided at a particular location in the RF signal processing path to provide an accurate test tone for purposes of IR calibration, while at the same time preventing undesired emissions from coupling to an antenna or other transmission source during such test mode operations.

As shown in FIG. 2A, tuner 200 includes both on-chip and off-chip components. Specifically, an antenna 210 is coupled to receive an incoming RF signal. In various implementations, antenna 210 is an off-chip antenna. Antenna 210 couples to an external matching network 215 which includes passive components like inductors and capacitors, and which in turn is coupled to a balun 220 configured to receive the incoming RF signal and convert the single-ended RF signal to a differential RF signal to be provided to differential signal processing paths 230 and 240. As shown, each differential signal path includes a pair of series-coupled coupling capacitors, namely coupling capacitors C1 and C3 and coupling capacitors C2 and C4. In an embodiment, capacitors C1 and C2 are about 400 femtoFarads and capacitors C3 and C4 are about 3 picoFarads. These coupling capacitors thus couple an incoming RF signal to an LNA 250. As will be described herein, the transconductor of LNA 250 includes a plurality of slices to receive the differential RF voltage and output a differential amplified RF current (corresponding to the input RF signal) to downstream portions of the signal processing path. For ease of illustration in FIG. 2, a load resistance RL is coupled to an output of LNA 250. Understand that additional processing of the amplified RF signals may occur, including a downconversion process performed by a mixer and additional signal processing at a lower frequency, e.g., at an IF.

Note that LNA 250 may, at high frequency, have a finite second order non-linearity. As such, when common mode cross-coupling occurs at the input of LNA 250, IR degradation can occur. For example, when a VCO is at a frequency of 2×LO (where LO is a local oscillator frequency) strong cross-coupling or electromagnetic interference is coupled as a common mode signal to the input of LNA 250, causing IR degradation even before the signal couples through the mixer (e.g., mixer 130 of FIG. 1). Embodiments thus provide an IR rejection circuit further downstream to correct both this source of interference as well as image noise caused by a mixing operation. In various embodiments, generation of a test tone signal may occur in a manner to enable this VCO cross-coupling to similarly impact the test tone signal to enable proper IR circuit calibration to occur. As such, embodiments preserve a front end configuration of a tuner during a test mode in which calibration operations occur, while at the same time preventing undesired emission of such test tones.

To provide a test tone for IR calibration purposes as described herein, a second transconductor 260 is present. In an embodiment, transconductor 260 may be implemented as at least one Gm slice, and in a particular embodiment may be implemented as a single Gm slice having the same configuration as a Gm slice of the transconductor of LNA 250 (in one particular example, the transconductor of LNA 250 may be implemented with at least 12 unit slices while transconductor 260 may be implemented with a single unit slice).

An injection source 265 is coupled to an input of transconductor 260. As seen, injection source 265 couples to a pair of common mode nodes CM1 and CM2, which are respectively common mode voltage nodes between differential signal paths 230 and 240. As seen, first and second pairs of parallel capacitors couple between differential signal paths 230 and 240. More specifically, capacitors C5 and C7 couple between the differential signal paths, with a midpoint between capacitors C5 and C7 corresponding to a first common mode node CM1. In turn, capacitors C6 and C8 couple between the differential signal paths, with a midpoint between capacitors C6 and C8 corresponding to a second common mode node CM2. In an embodiment, parallel capacitors C5-C8 may be between approximately 25 and 100 femtoFarads.

In one embodiment, injection source 265 may be implemented using an auxiliary phase lock loop (PLL). Of course understand that in other embodiments, other injection sources, such as a given voltage source may be used. In an embodiment, auxiliary PLL 265 may couple through a buffer (not shown in FIG. 2A) having a cascaded differential amplifier that is controlled to be disabled outside of a test mode of operation. In general, during test mode operations, a frequency of the generated test tone signal may be at a value slightly offset from a LO frequency. For example, assume for reception of a desired channel, a VCO is controlled to generate an LO frequency of 2.45 GHz. In such case, the auxiliary PLL may be controlled to operate at a frequency offset from this value by a given amount, e.g., by an IF frequency. For example, in this case auxiliary PLL 265 may be controlled to generate the test tone signal at 2.45 GHz+/−1 MHz.

For purposes of illustrating a representative product, understand that tuner 200 can be implemented as a transceiver. Such transceiver includes a transmission path (not shown for ease of illustration in FIG. 2A), which may couple to a power amplifier (PA) 225 that in turn couples via balun 220 and matching network 215 to antenna 210 in a transmit direction. Understand that additional RF front end components, such as controllable attenuators, transmit/receive switch, among other components, are not shown. Furthermore, understand while shown at this high level in the embodiment of FIG. 2A, many variations and alternatives are possible.

Figure 2B:
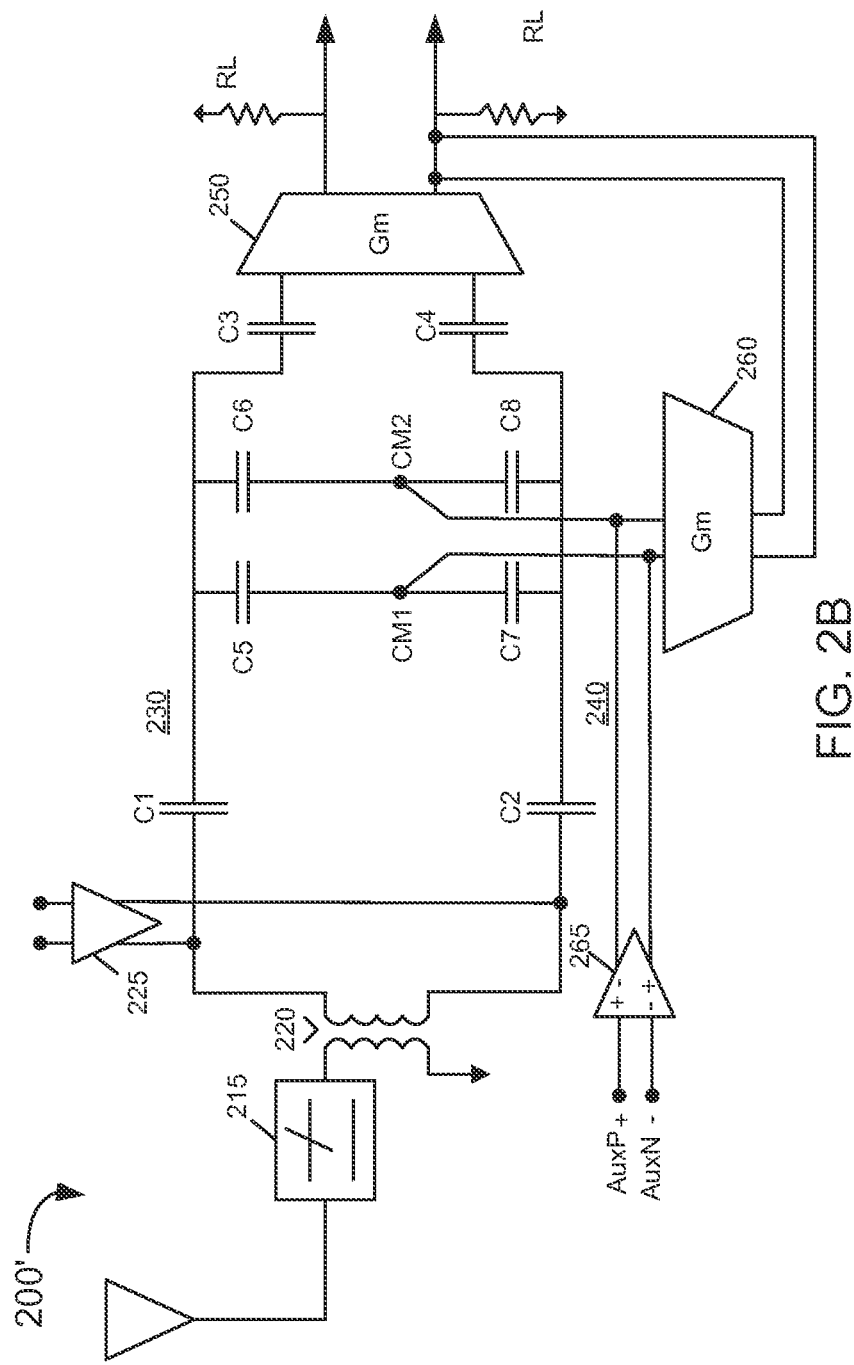
FIG. 2B is another block diagram of a portion of a tuner in accordance with another embodiment.

Referring now to FIG. 2B, shown is a block diagram of a receiver 200' in accordance with another embodiment. In the embodiment of FIG. 2B, details regarding the injection source is shown. More specifically, injection source 265 is implemented as a buffer that receives an output of an auxiliary PLL (not shown for ease of illustration in FIG. 2B). As seen, a differential test tone signal is coupled to an input of buffer 265 (as AuxP and AuxN) as a clock input signal. Buffer 265 in turn buffers and outputs this signal as a differential test tone signal, provided to the input of transconductor 260, which as shown is coupled to the common mode nodes CM1 and CM2.

In an embodiment, the auxiliary PLL may be controlled to output the test signal at a given power level within a threshold level of a power level of an interferer signal received via antenna 210. This control may enable the interferer signal to be at least substantially canceled at common mode nodes CM1 and CM2.

Figure 3A:
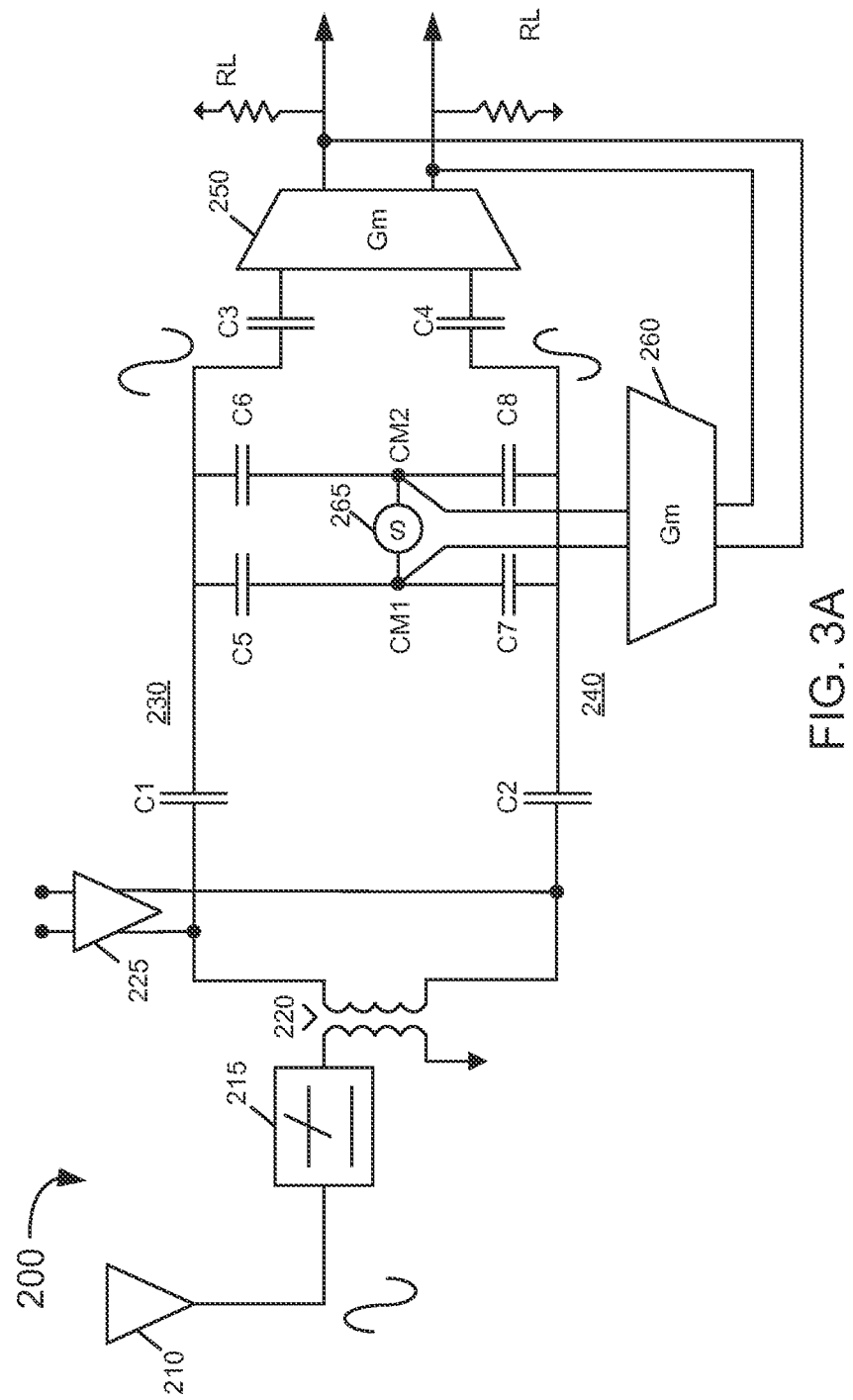
FIG. 3A is an example of forward isolation capabilities realized by coupling of an injection source at a common mode point of a differential signal processing path.

Referring now to FIG. 3A, shown is an example of forward isolation capabilities realized by coupling of an injection source at a common mode point of a differential signal processing path. As seen in FIG. 3A, tuner 200 is configured the same as in FIG. 2A. An incoming RF signal (single-ended) is received via antenna 210, converted to a differential signal and is presented with opposite polarities via differential signal paths 230 and 240, to be provided to the input of LNA 250. However, due to the common mode coupling of injection source 265 at common mode nodes CM1 and CM2, the input RF signal from antenna 210 is canceled or at least substantially canceled at this point, such that the injection source, when enabled, is isolated from incoming RF signals.

Figure 3B:
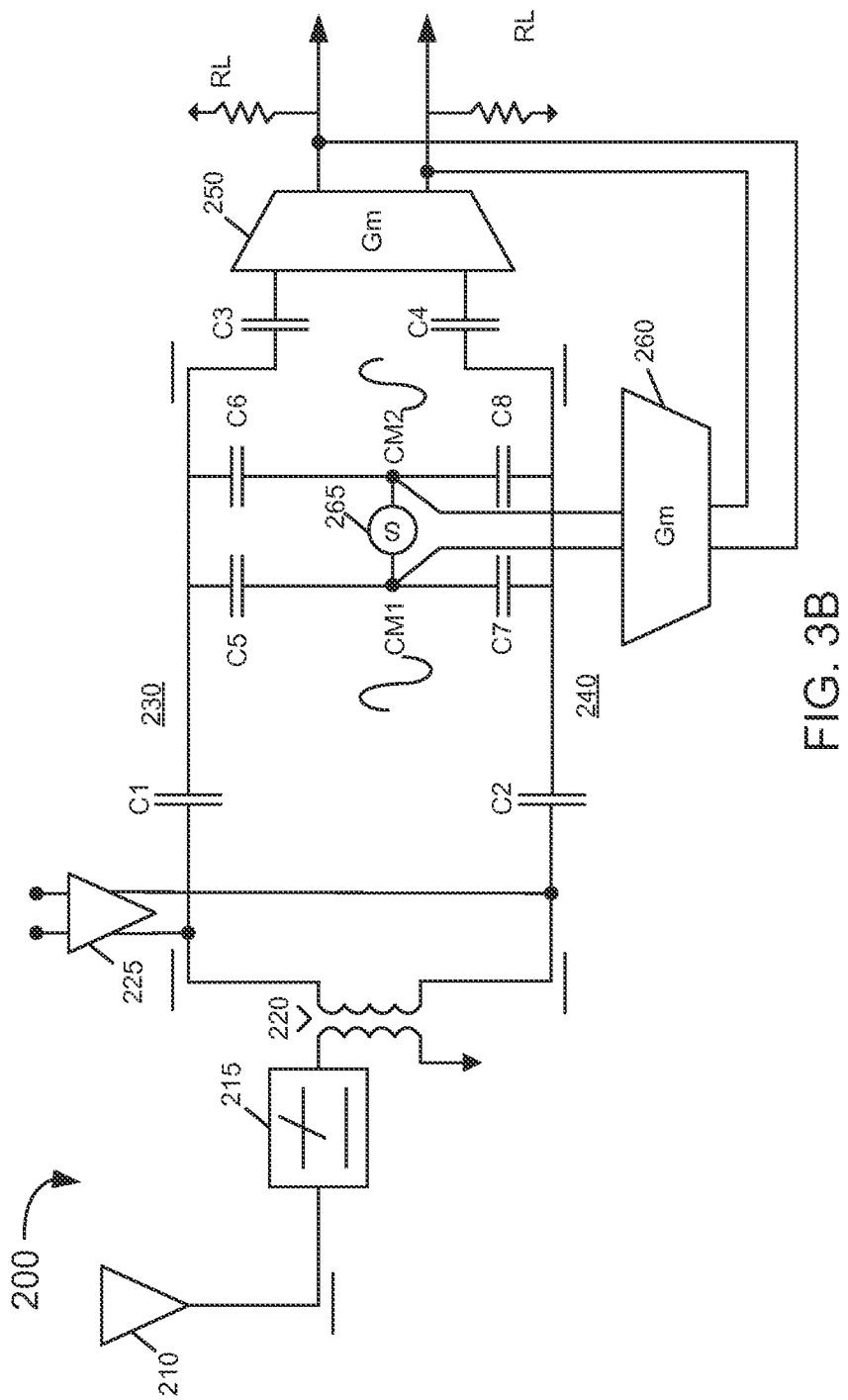
FIG. 3B is an example of emission prevention of a test tone signal in accordance with an embodiment.

FIG. 3B shows an example of emission prevention of a test tone signal in accordance with an embodiment. In the same fashion, by way of the common mode coupling of injection source 265, emissions from the tuner from this source (via antenna 210) during a test mode can be reduced or eliminated. Injection source 265 generates a differential test tone such that the signals of opposing polarities are provided to transconductor 260. With these signals of opposing polarities, cancellation occurs on differential signal paths 230 and 240, such that substantially minimal or no leakage emissions couple through antenna 210 (and where any emission is below a given required minimum emission specification). Any such leakage may be controlled by controlling mismatches in capacitors of pairs of parallel capacitors C5/C7 and C6/C8.

Figure 3C:
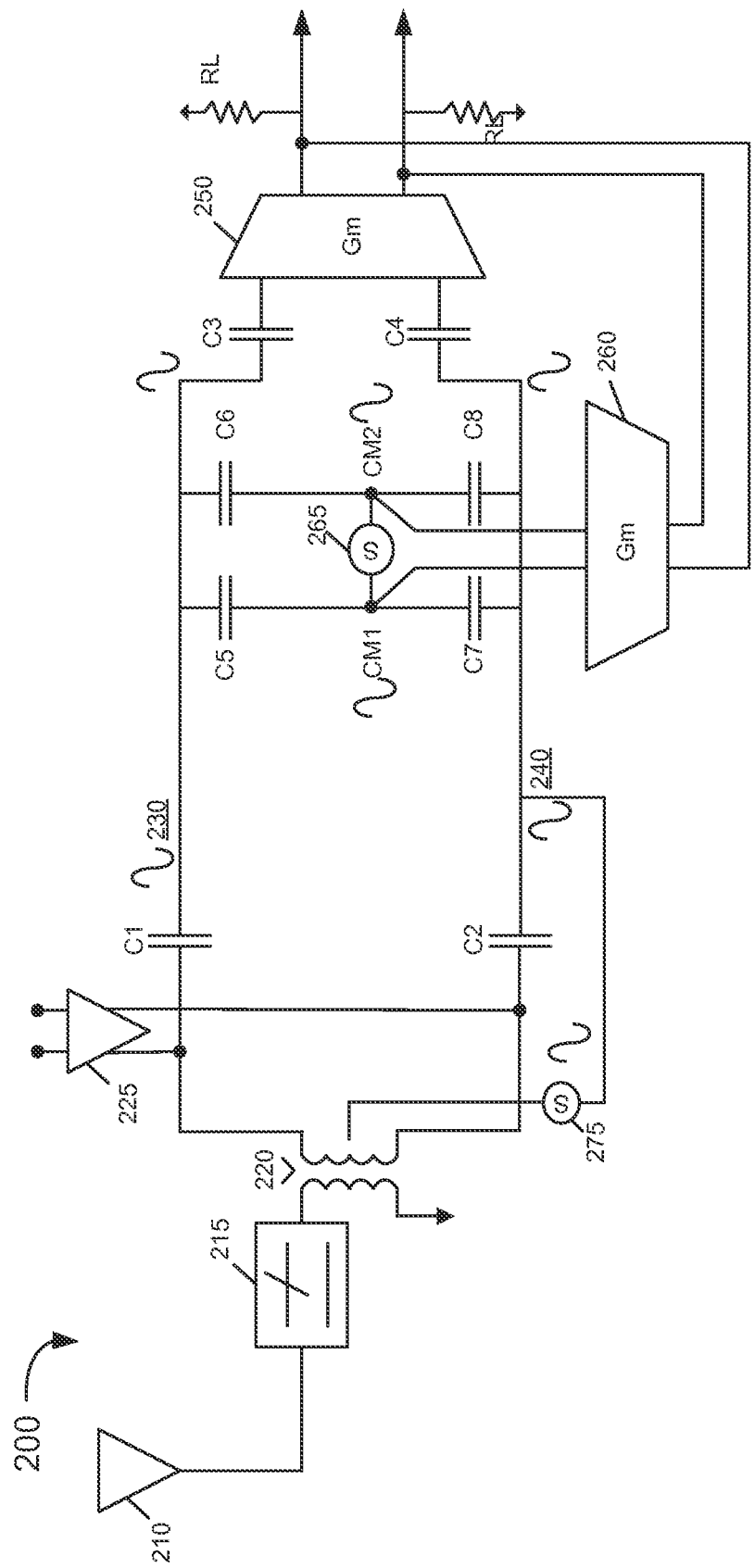
FIG. 3C is an illustration of a spurious voltage controlled oscillator (VCO) coupling by way of a VCO coupling source in accordance with an embodiment.

As described above, one source of image noise existing in a receiver is via spurious or unwanted coupling from a VCO or other controlled oscillator that generates a LO frequency (such as for use in one or more downconversion processes within the receiver). Referring now to FIG. 3C, illustrated is spurious VCO coupling by way of a VCO coupling source 275. As seen, source 275 causes unwanted coupling of VCO signals into differential signal paths 230 and 240. Because these unwanted VCO coupling signals are present both at common mode nodes CM1 and CM2 and at the input to LNA 250, accurate IR calibration can be realized during a test mode, in the presence of this VCO coupling (e.g., at a level of 2×LO).

Figure 4:
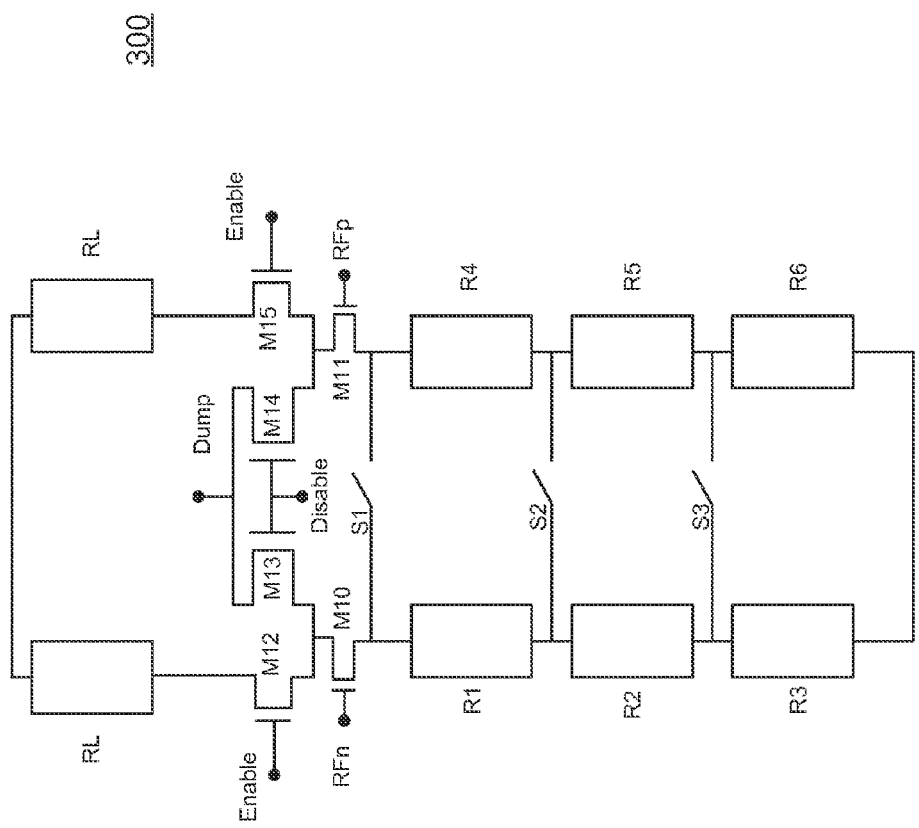
FIG. 4 is a schematic diagram of a slice of a transconductor in accordance with an embodiment.

Referring now to FIG. 4, shown is a schematic diagram of a slice of a transconductor in accordance with an embodiment. As shown in FIG. 4, slice 300 may be a slice of the LNA transconductor. In the embodiment shown, an incoming differential RF signal (RFn and RFp) is provided to corresponding gate terminals of MOSFETs M10 and M11 and is output via output terminals of MOSFETs M10 and M11 to a resistive load implemented as a pair of resistors RL.

Note further that when a given slice is to be enabled, these output signals from MOSFETs M10 and M11 couple through corresponding MOSFETs M12 and M15, which are enabled by a control signal, Enable. Instead when a given slice is to be disabled (e.g., the single slice of the IR calibration source path during normal mode, or a given slice of an LNA that is controlled to be disabled for a particular desired gain level), a Disable signal is active instead (with the Enable signal being inactive). The disable signal is coupled to gate terminals of corresponding MOSFETs M13 and M14, such that the outputs of MOSFETs M10 and M1 couple instead to a dump destination (Dump) to steer the current away from the signal path. In an embodiment, this dump location may be within a voltage regulator. As further illustrated in FIG. 4, input terminals of MOSFETs M10 and M11 couple to one or more of a set of series degeneration resistors R1-R3 and R4-R6 (as controlled by corresponding switches S1-S3). Although not shown, understand that a slice of the IR calibration path transconductor may be similarly configured; however the input MOSFETs of this transconductor are gated instead by the test tone signal (and thus this transconductor outputs a different current level). In an embodiment, both transconductors may be coupled to a common DC bias circuit (and at a common DC bias level). Understand while shown with this particular implementation in FIG. 4, many variations and alternatives are possible.

Figure 5:
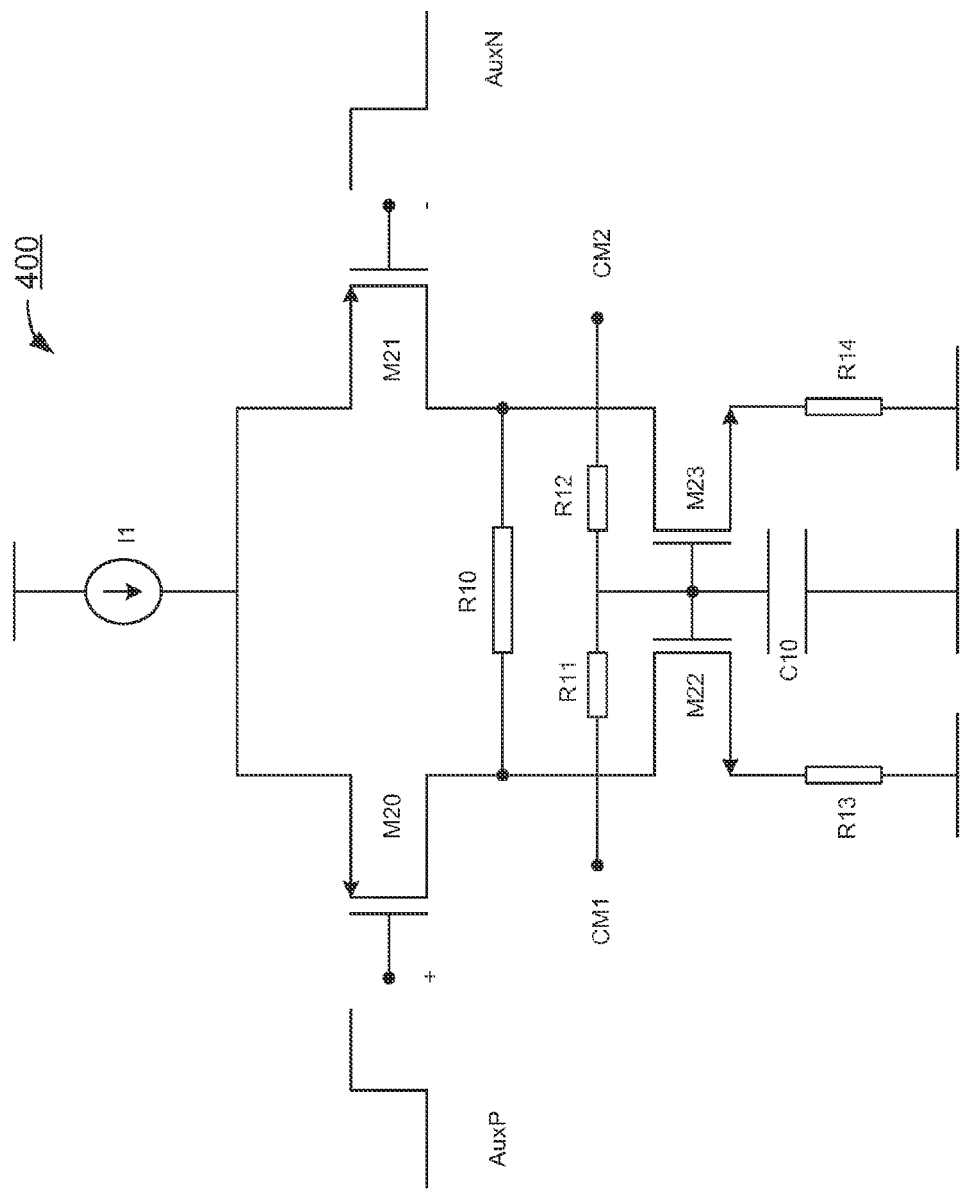
FIG. 5 is a schematic diagram of a buffer in accordance with an embodiment.

Referring now to FIG. 5, shown is a schematic diagram of a buffer in accordance with an embodiment. As shown in FIG. 5, buffer 400 may be configured to receive an incoming clock signal, buffer and output the clock signal when in a test mode to provide the test signal at an appropriate frequency for purposes of IR rejection calibration. As seen in FIG. 5, buffer 400 may be implemented as a cascoded differential amplifier. As seen, MOSFETs M20 and M21 (which in an embodiment may be implemented as pMOS transistors) have gate terminals configured to receive the incoming differential clock signal (AuxP and AuxN), as generated by an auxiliary PLL. As further shown in FIG. 5, the source terminals of MOSFETs M20 and M21 couple to a current source I1 in turn coupled to a supply voltage. The drain terminals of MOSFETs M20 and M21 couple to corresponding drain terminals of MOSFETs M22 and M23. As seen, these commonly gated MOSFETs M22 and M23 have gate terminals coupled to a midpoint between a pair of resistors R11 and R12, which in turn are coupled to the common mode nodes CM1 and CM2 (and also coupled to a capacitor C10), such that a buffered test tone signal is coupled to the auxiliary path transconductor. The drain terminals of MOSFETs M20 and M21 (and the drain terminals of MOSFETs M22 and M23 further couple to a resistor R10. (The DC bias voltage at the gate terminals of MOSFETs M22 and M23 is designed to be the same as the DC bias voltage for the RF input of the transconductor of the LNA).

The source terminals of MOSFETs M22 and M23 couple to resistors R13 and R14. When buffer 400 is to be disabled during a normal mode of operation, no input clock signal is provided and as such, buffer 400 remains in an inactive state. Understand while shown with this particular configuration in the embodiment of FIG. 5, many variations and alternatives are possible.

Figure 6A:
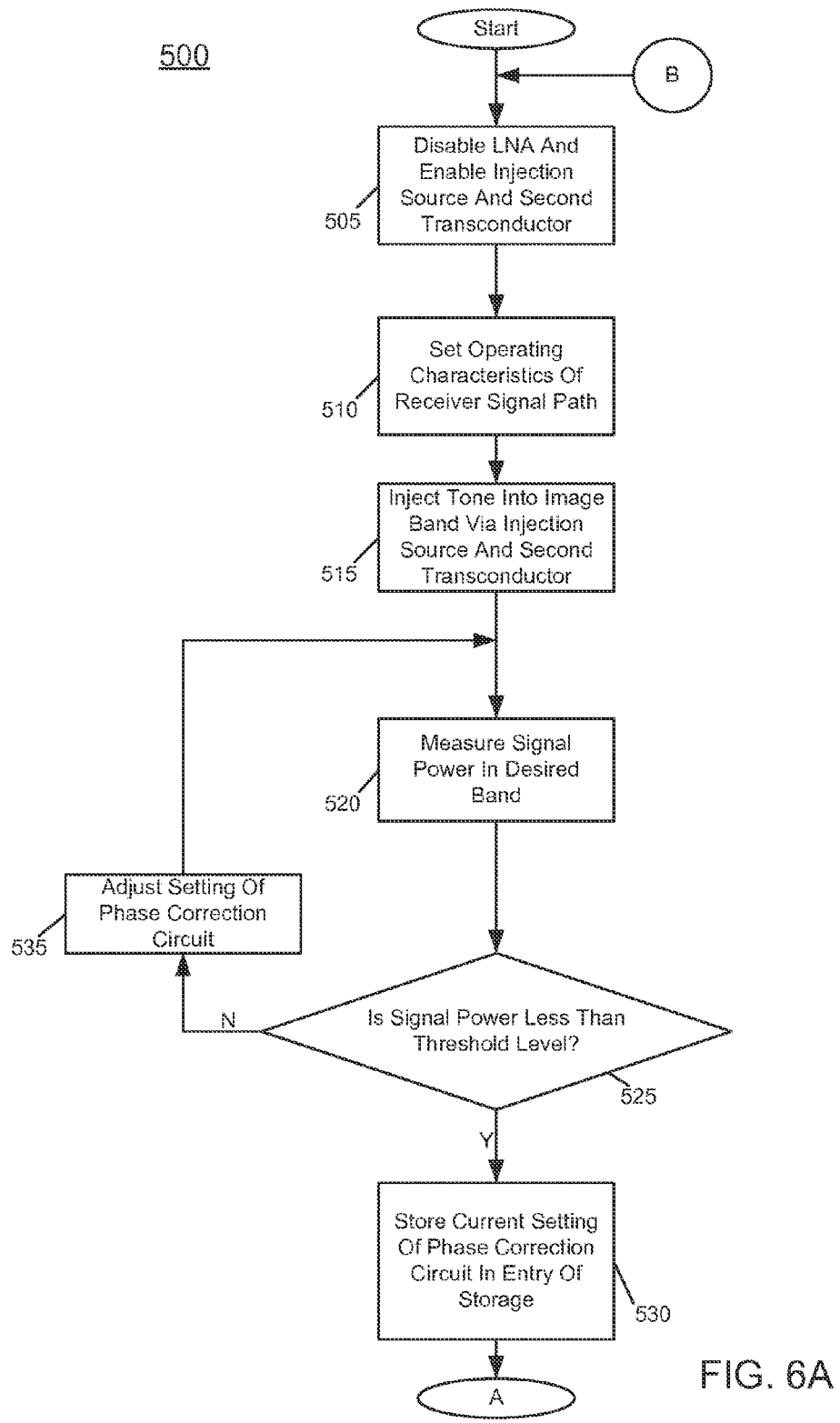
FIGS. 6A-6B are flow diagrams of a method for determining control values for an image rejection calibration circuit in accordance with an embodiment.
Figure 6B:
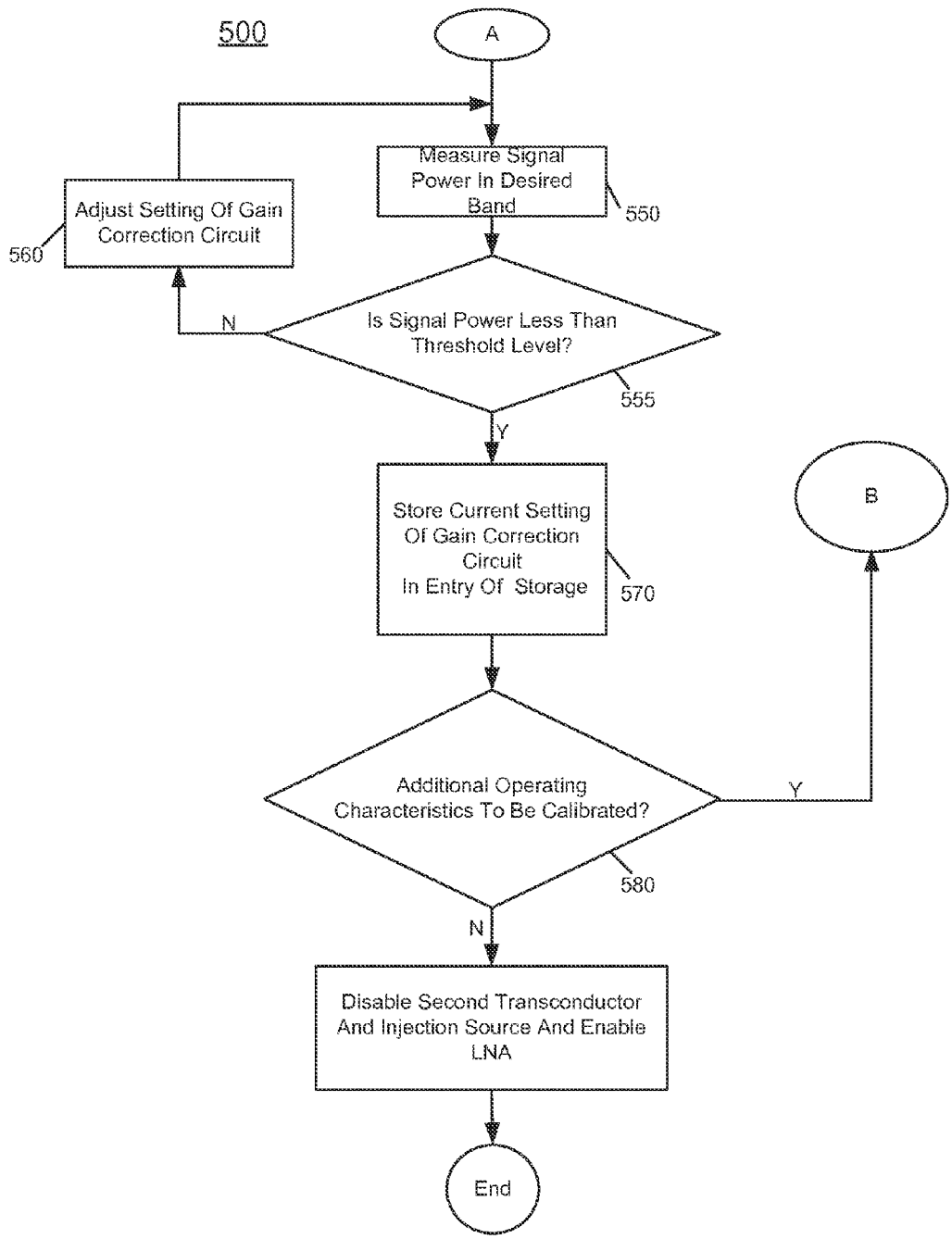

Referring now to FIGS. 6A-6B, shown are flow diagrams of a method for determining control values for an image rejection calibration circuit in accordance with an embodiment. As shown in FIG. 6A, method 500 may be performed, e.g., during manufacture of a device including a receiver having an IRCAL circuit as described herein. Of course, such calibration or test mode operations also may be performed in the field during normal system operation. As part of manufacturing testing and configuration of the product, the receiver can be tested using a tone injected into an image band, and measuring information regarding a processed version of this signal, e.g., in a digital portion of the receiver. Based on this information and other operating characteristics of the receiver, control values can be independently and orthogonally generated for both the phase correction portion and the gain correction portion of the IRCAL circuit and stored into an appropriate location, e.g., into a calibration table of a non-volatile storage of the device.

As seen in FIG. 6A, method 500 begins at block 505 by disabling an LNA of the receiver and enabling an injection source and a second transconductor of an auxiliary path (where the LNA itself is formed of a transconductor). Such enabling and disabling may be by appropriate control of switches such as transistors, as discussed above. Thereafter, control passes to block 510, where operating characteristics of a receiver signal path are set. Such operating characteristics may include an operating voltage of the receiver, filter settings for a complex filter of the signal path, among other parameters. Understand that in addition to setting the operating characteristics in the receiver signal path, an initial setting for the IR calibration circuit also may be set. This initial setting may vary, in different implementations. However, in one embodiment the initial setting for a phase correction circuit may be to control all controllable admittance elements of the phase correction circuit to be coupled in parallel between an in-phase signal path and a common mode voltage node. Similarly, for a gain correction circuit, the initial setting may be to control all controllable admittance elements to be coupled in parallel between a quadrature signal path and a common mode voltage node.

Thereafter, at block 515 a tone is injected into the image band. This tone injection may be via generation of the tone signal in the injection source (an auxiliary PLL or other voltage source), controlled to be at a given test frequency (e.g., within an image band). Thereafter, the injected tone may be amplified in the second transconductor and passed as a current to further portions of the receiver, including a mixer, which receives this tone as a simulation of an RF signal having characteristics affected by various interference sources as described above. In an embodiment in which a receiver is configured for low-side LO operation, meaning that during operation an LO is controlled to generate an LO frequency below a desired channel frequency (such that an image is present on the low side of the desired band), this tone may be set at a frequency slightly less than the LO frequency.

Thereafter, control passes to block 520 where signal power in the desired band (which may be at the desired channel frequency) is measured. That is, the receiver is operated to process the information of both the in-phase and quadrature signal paths. Note that without reception of any other signal other than this tone, the only information being processed in the desired band relates to image signal. In an embodiment, the signal power in the desired band may be measured in a digital portion, after the signal is fully processed through the IF signal path, digitized and then provided to digital processing circuitry. In one embodiment, a received signal strength indicator (RSSI) value may be used to perform the measurement.

Still referring to FIG. 6A, control next passes to diamond 525 where it can be determined whether the signal power as measured above exceeds a threshold level. In an embodiment, this threshold level may be a given power level, e.g., based on a receiver blocking performance specification, or may be a minimum (that depends on the gain error, i.e., a minima in power vs. gain correction). If the signal power is determined not to exceed this threshold, control passes to block 530, where the current setting of the phase correction circuit may be stored. More specifically, this value may be stored in an entry of the non-volatile storage. In a given implementation, a table to be stored in the non-volatile storage includes multiple entries, where each entry is associated with a particular set of operating characteristics of the receiver (e.g., operating voltage, filter setting, gain setting or so forth), and the values to be stored in the entry may correspond to the control settings for the phase correction circuit (e.g., a control value to control a switching network of the phase correction circuit to enable the appropriate setting of controllable admittances, as described above). Furthermore, this same entry may also include a given setting for the gain correction circuit (as discussed further below).

Thereafter, continued calibration operations at the current operating characteristics of the receiver signal path may be performed, for purposes of calibrating the gain correction circuit, as described with reference to FIG. 6B.

Still with reference to FIG. 6A, if instead at diamond 525 it is determined that the signal power does exceed the threshold level, control passes to block 535 where a setting of the phase correction circuit may be adjusted. For example, one or more additional controllable admittance elements may be switched from a common mode voltage node to the quadrature signal path (either the positive or negative portion of the signal path, in a differential implementation). Thereafter, control passes back to block 520, discussed above for an updated signal power measurement in the desired band and continued operation of the method.

After setting the control value for the phase correction circuit, control continues to block 550 of FIG. 6B, where signal power in the desired band is measured. Next at diamond 555, it can be determined whether the signal power as measured above exceeds the threshold level. If the signal power is determined not to exceed this threshold, control passes to block 570, where the current setting of the gain correction circuit may be stored into an entry of the non-volatile storage (e.g., the same entry in which the setting for the phase correction circuit is stored). Then it can be determined whether correction values are to be generated for additional operating characteristics of the receiver at diamond 580 (e.g., different operating voltage or filter settings). If so, method 500 may be performed again; otherwise control passes to block 590 where the second transconductor and injection source may be disabled and the LNA can be enabled so that normal receiver operation can occur or continue such that the method concludes.

If it is determined that the signal power does exceed the threshold level, control passes to block 560 where a setting of the gain correction circuit may be adjusted. For example, one or more additional controllable admittance elements may be switched from a common mode voltage node to the quadrature signal path (either the positive or negative portion of the signal path, in a differential implementation). Thereafter, control passes back to block 550, discussed above for an updated signal power measurement in the desired band and continued operation of the method.

Embodiments can be implemented in many different types of systems incorporating an RF receiver. Examples include broadcast radios, satellite radios, wireless communication systems including wide area and wireless local area network systems. Furthermore, embodiments can be incorporated into a variety of integrated circuits such as microcontroller units (MCUs) such as for embedded systems, Internet-connected devices and so forth.

Figure 7:
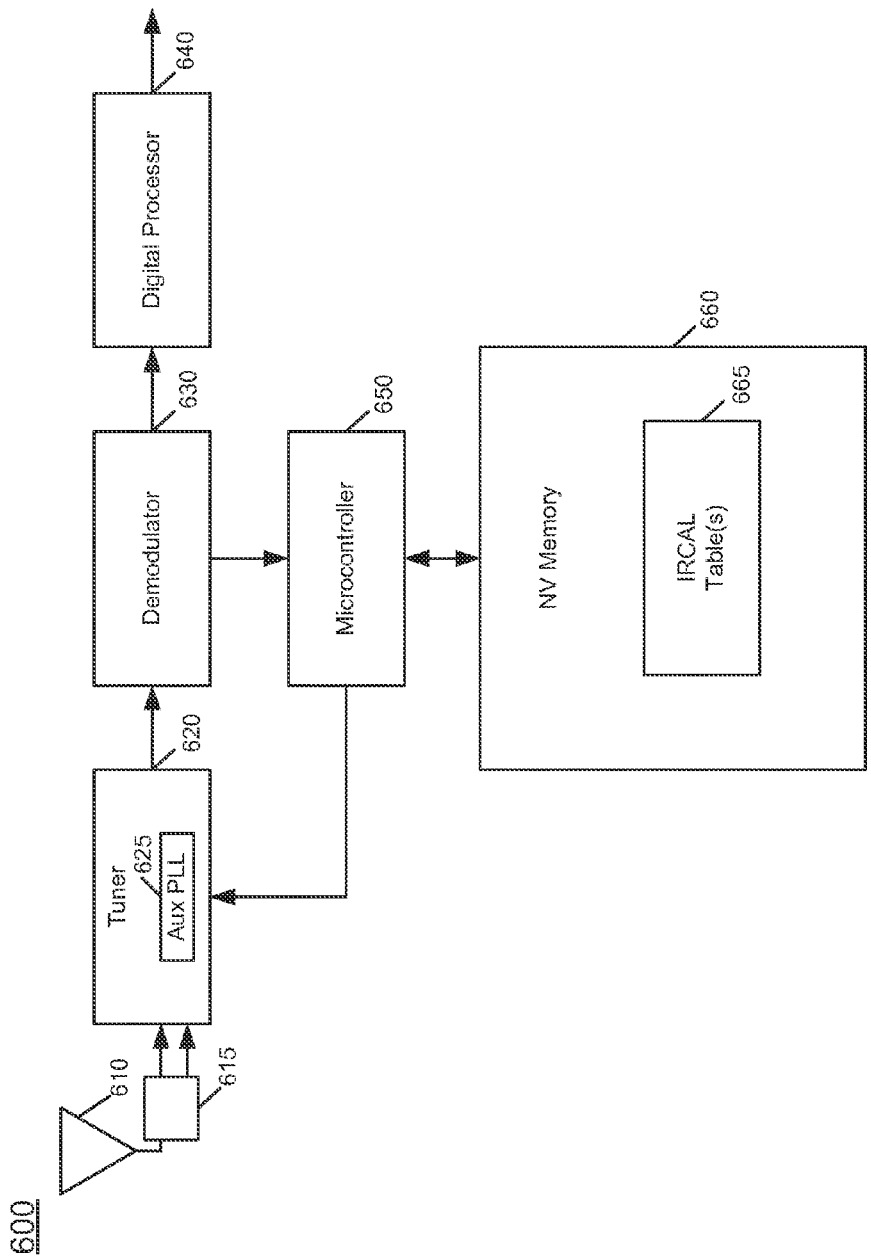
FIG. 7 is a block diagram of a system in accordance with an embodiment.

Referring now to FIG. 7, shown is a block diagram of a system in accordance with an embodiment. As shown in FIG. 7, system 600 is any type of end user product, an embedded system or so forth, or integrated circuit to be incorporated into such product. As seen, system 600 includes an antenna 610 in turn coupled to a single-ended-to-differential signal converter 615 (e.g., formed of a balun). Other than this antenna and signal converter, all other components shown in FIG. 7 may be implemented within a single integrated circuit and can be formed on a single semiconductor die, in some examples. From antenna 610, RF signals are provided to a tuner 620 which may be a complex tuner having a low IF architecture, such as described above with regard to FIG. 1 (and which may include an auxiliary PLL 625 and auxiliary signal path including an auxiliary transconductor, as described herein). Tuner 620 provides downconverted and digitized signals to a demodulator 630, which demodulates the digitized information and provides it to a digital processor 640 for desired processing.

To provide control of an IRCAL circuit within tuner 620, a microcontroller 650 is present and may provide control signals to tuner 620 to cause switching or other control of controllable elements of the IRCAL circuit and to control operation of auxiliary PLL 625 and an auxiliary signal path during IR calibration of a test mode). More specifically, these control signals may be obtained from one or more IRCAL tables 665 stored in a non-volatile memory 660. To enable communication of control signals, microcontroller 650 may execute instructions stored in a non-transitory storage medium, included within or otherwise accessible to the microcontroller. In some embodiments, this table may be generated during manufacture using method 500 of FIGS. 6A and 6B, which in an embodiment also may be implemented as instructions stored in a non-transitory storage medium accessible to microcontroller 650 and/or another programmable logic. Of course in other embodiments, dynamic control of an IRCAL circuit can occur using microcontroller 650, which receives feedback information from a demodulator 630. Understand while shown at this high level in FIG. 7, many variations and alternatives are possible.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
    a low noise amplifier (LNA) comprising a first transconductor having an input to receive a differential input radio frequency (RF) signal via a first differential signal line and a second differential signal line and an output to output a differential amplified RF signal to a RF signal path; and
    a second transconductor having an input coupled to a first common mode node and a second common mode node coupled between the first differential signal line and the second differential signal line to receive a test tone signal and an output to output an amplified test tone signal to the RF signal path, wherein the first common mode node is coupled between first and second parallel capacitors and the second common mode node is coupled between third and fourth parallel capacitors.

2. The apparatus of claim 1, further comprising a controller to enable the second transconductor during a test mode and to thereafter disable the second transconductor, and disable the first transconductor during the test mode and to thereafter enable the first transconductor.

3. The apparatus of claim 1, further comprising an auxiliary phase lock loop (PLL) to generate the test tone signal, the auxiliary PLL coupled to the first common mode node and the second common mode node via a buffer.

4. The apparatus of claim 1, further comprising a balun to receive an input RF signal, and to output the differential input RF signal.

5. The apparatus of claim 4, further comprising a matching network to provide the input RF signal to the balun.

6. The apparatus of claim 1, wherein the first and second parallel capacitors are coupled between the first differential signal line and the second differential signal line, the first differential signal line to provide a first portion of the differential input RF signal to the LNA and the third and fourth parallel capacitors are coupled between the first differential signal line and the second differential signal line, the second differential signal line to provide a second portion of the differential input RF signal to the LNA.

7. The apparatus of claim 1, further comprising an injection source to provide the test tone signal to the second transconductor, the injection source comprising:
an oscillator to generate the test tone signal;
a buffer comprising a cascoded differential amplifier having an input coupled to the oscillator to receive the test tone signal and an output coupled to the first common mode node and the second common mode node to provide the test tone signal to the second transconductor.

8. The apparatus of claim 1, wherein the first transconductor includes a first plurality of slices and the second transconductor includes at least one slice, a number of the first plurality of slices greater than a number of the at least one slice.

9. The apparatus of claim 8, wherein each of the first plurality of slices and the at least one slice are formed of a unit slice, wherein the unit slice is to be biased with a common DC bias voltage source.

10. The apparatus of claim 8, wherein each of the first plurality of slices comprises:
a first pair of transistors to be gated by the differential input RF signal; and
a second pair of transistors to be gated by an enable signal, wherein an output terminal of each of the second pair of transistors is to couple to a load, when the enable signal is active.

11. The apparatus of claim 10, further comprising a first control transistor coupled to a first one of the first pair of transistors, the first control transistor to be gated by a disable signal, which when active, is to cause an output of the first one of the first pair of transistors to be output to a dump location and not to couple to the load.

12. A tuner comprising:
a radio frequency (RF) signal path having a first signal path portion and a second signal path portion;
a first differential transconductor coupled to receive a RF signal via the first signal path portion and the second signal path portion and to output an amplified RF signal to a mixer;
a first pair of capacitors coupled between the first signal path portion and the second signal path portion and having a first common mode node adapted between the first pair of capacitors;
a second pair of capacitors coupled between the first signal path portion and the second signal path portion and having a second common mode node adapted between the second pair of capacitors; and
a second differential transconductor coupled to receive a test signal from the first common mode node and the second common mode node in a test mode and to output a test output to the mixer.

13. The tuner of claim 12, further comprising a controller to cause a phase lock loop (PLL) coupled between the first common mode node and the second common mode node and the second differential transconductor to generate the test signal at a second frequency, the second frequency offset from a frequency of a local oscillator by an offset value, the local oscillator to generate a mixing signal to enable the mixer to downconvert the amplified RF signal to a downconverted frequency signal.

14. The tuner of claim 13, wherein the PLL is to output the test signal at a first power level, the first power level within a threshold level of a power level of an interferer signal received via an antenna coupled to the RF signal path, wherein the interferer signal is to be at least substantially canceled at the first common mode node and the second common mode node.

15. The tuner of claim 13, wherein the second differential transconductor is coupled to receive a common mode voltage controlled oscillator (VCO) coupling signal, the common mode VCO coupling signal further coupled to the first differential transconductor, and wherein the RF signal is, during the test mode, to be substantially canceled at the first common mode node and the second common mode node.

16. The tuner of claim 12, wherein the test output comprises an image rejection calibration source to calibrate an image rejection circuit of the tuner.

17. The tuner of claim 12, further comprising a controller to enable the second differential transconductor during the test mode and to thereafter disable the second differential transconductor, and disable the first differential transconductor during the test mode and to thereafter enable the first differential transconductor.

18. A method comprising:
disabling a low noise amplifier (LNA) of a receiver during a test mode;
enabling an injection source of the receiver during the test mode, the injection source coupled between common mode nodes at an input of the LNA and an input of a transconductor, wherein a first common mode node of the common mode nodes is coupled between first and second parallel capacitors and a second common mode node of the common mode nodes is coupled between third and fourth parallel capacitors, the transconductor having an output to couple to an output of the LNA during the test mode;
injecting, via the injection source, a tone into the receiver at a frequency of an image band;
measuring a signal power in a desired band responsive to processing the injected tone in the receiver; and
calibrating an image rejection circuit of the receiver based at least in part on the signal power.

19. The method of claim 18, wherein disabling the LNA comprises steering a current output of the LNA to a voltage regulator, and enabling the injection source comprises coupling a phase lock loop (PLL) to a buffer, the buffer coupled to the input of the transconductor.

20. The method of claim 18, further comprising:
if the signal power in the desired band is less than a threshold level, storing a setting of a phase correction circuit of the image rejection circuit in an entry of a non-volatile storage; and
if the signal power in the desired band is greater than the threshold level, iteratively updating the setting of the phase correction circuit and measuring the signal power until the signal power is less than the threshold level, and thereafter storing the phase correction circuit setting in the non-volatile storage entry.

* * * * *